(12) United States Patent
Joachim et al.

(10) Patent No.: US 6,876,590 B2
(45) Date of Patent: Apr. 5, 2005

(54) 2T2C SIGNAL MARGIN TEST MODE USING A DEFINED CHARGE EXCHANGE BETWEEN BL AND/BL

(75) Inventors: Hans-Oliver Joachim, Kanagawa-ken (JP); Michael Jacob, Kanagawa-ken (JP); Nobert Rehm, Kanagawa-ken (JP)

(73) Assignee: Infineon Technologies, AG (DE)

( * ) Notice: Subject to any disclaimer, the term of this patent is extended or adjusted under 35 U.S.C. 154(b) by 93 days.

(21) Appl. No.: 10/301,548

(22) Filed: Nov. 20, 2002

(65) Prior Publication Data

US 2004/0095821 A1 May 20, 2004

(51) Int. Cl.[7] ............................................. G11C 29/00
(52) U.S. Cl. ..................... 365/201; 365/145; 324/765; 324/769; 714/718
(58) Field of Search ................................. 365/201, 145, 365/203, 149, 202; 324/765, 769; 714/718

(56) References Cited

U.S. PATENT DOCUMENTS

| | | | |
|---|---|---|---|
| 5,126,740 A | 6/1992 | Kawada | |
| 5,265,056 A | 11/1993 | Redman et al. | |
| 5,339,273 A | 8/1994 | Taguchi | |
| 5,610,867 A | 3/1997 | Toshiaki et al. | |
| 5,751,627 A | * 5/1998 | Ooishi | 365/145 |
| 6,002,354 A | 12/1999 | Itoh et al. | |
| 6,034,884 A | * 3/2000 | Jung | 365/145 |
| 6,055,200 A | * 4/2000 | Choi et al. | 365/201 |
| 6,411,540 B1 | * 6/2002 | Ashikaga | 365/145 |
| 6,525,956 B2 | * 2/2003 | Murakuki | 365/145 |
| 2002/0093847 A1 | 7/2002 | Yoshihiro | |

FOREIGN PATENT DOCUMENTS

| | | |
|---|---|---|
| EP | 0892 408 | 1/1999 |
| EP | 0920 032 | 6/1999 |
| EP | 1087 405 | 3/2001 |
| WO | WO 00/26919 | 5/2000 |

* cited by examiner

*Primary Examiner*—Michael S. Lebentritt
*Assistant Examiner*—N. Nguyen
(74) *Attorney, Agent, or Firm*—Fish & Richardson P.C.

(57) ABSTRACT

The present invention provides a test mode section for facilitating a worst case product test sequence for signal margin to ensure full product functionality over the entire component lifetime taking all aging effects into account. A semiconductor memory test mode configuration includes a first capacitor for storing digital data and connecting a cell plate line to a first bit line through a first select transistor. The first select transistor activated through a connection to a word line. A second capacitor stores digital data and connects the cell plate line to a second bit line through a second select transistor. The second select transistor is activated through a connection to the word line. A sense amplifier is connected to the first and second bit lines and measures a differential read signal on the first and second bit lines. A third transistor transfers charge between the first and second bit lines third to reduce the differential read signal.

11 Claims, 3 Drawing Sheets

2T2C SIGNAL MARGIN TEST MODE USING A DEFINED CHARGE EXCHANGE BETWEEN BL AND/BL

RELATED APPLICATIONS

The present disclosure is related to the following concurrently filed applications, all of which are to be assigned to Infineon Technologies AG and all of which are hereby incorporated by reference in their entirety into the present disclosure:

"2T2C Signal Margin Test Mode Using Resistive Element" to Michael Jacob et al., Ser. No. 10/301,546 "2T2C Signal Margin Test Mode Using Different Pre-Charge Levels for BL and /BL" to Michael Jacob et al., Ser. No. 10/301,547; and "2T2C Signal Margin Test Mode Using a Defined Charge and Discharge of BL and /BL" to Hans-Oliver Joachim et al., Ser. No. 10/301,529.

FIELD OF THE INVENTION

The present invention relates to the implementation of circuits for testing signal margin in memory cells operating in a 2T2C configuration.

BACKGROUND OF THE INVENTION

In semiconductor memories, reliability issues have become more complicated with increasing memory sizes, smaller feature sizes and lower operating voltages. It has become more important to understand the cell signal sensing operation, the signal of memory cells and the limiting factors. One particularly important characteristic in reliability determinations of semiconductor memories is the signal margin. In a 2T2C memory cell configuration, the signal margin is a measure of the zero-versus-one signal measured by the sense amplifier. It is particularly useful to be able to measure the signal margin at product level. The results of product-level signal-margin tests can be used to optimize reliability and as well as the sense amplifier design and the bit line architecture to optimize dynamic memory cell readout. Moreover, a product level test sequence for signal margin can help ensure full product functionality over the entire component lifetime taking all aging effects into account.

Among the more recent semiconductor memories, Ferroelectric Random Access Memories (FeRAMs) have attracted much attention due to their low-voltage and high-speed operation in addition to their non-volatility. FIG. 1 shows a typical prior art FeRAM memory cell in a 2T2C configuration. The 2T2C configuration utilizes two transistors and two capacitors per bit. The 2T2C configuration is beneficial because it allows for noise cancellation between the transistors. Two storage capacitors (Cferro) are connected to a common plate line (PL) on one side and to a pair of bit lines (BL, /BL) on the other side via two select transistors (TS). The two transistors are selected simultaneously by a common word line (WL). A dedicated bit line capacitance (CBL) is connected to each bit line. This bit line capacitance is required for the read operation of the memory cell. The differential read signal on the bit line pair is evaluated in a connected sense amplifier. The polarization is always maintained in directly opposed states in the two storage capacitors of one 2T2C memory configuration.

The signals on the bit lines during a read access are shown in FIG. 2. FIGS. 2 and 4 of the present disclosure all include a plot of the read signals on BL /BL vs. time In these plots, one of the lines represents the read signal on BL and one represents the read signal on /BL. Which signal is represented by which of the lines depends on whether the read signal on BL or the read signal on /BL is larger. First, both bit lines BL and /BL are pre-charged to the same level (e.g. 0V in the figure). At time t0 the plate is activated and a read signal appears on the bit lines according to the capacitance ratio $C_{ferro}/C_{BL}$. The effective capacitance of a ferroelectric capacitor depends on its polarization state prior to the read operation. At time t1 the full read signals are developed on the two bit lines. At t2 the sense amplifier is activated and the bit line signals are boosted to the full bit line voltages. At t3 the sense amplifier is deactivated and the access cycle ends at t4.

A good solution for determining signal margin in FeRAM memory cells utilizing a single transistor and capacitor (1T1C) is to sweep the reference bit line voltage. A prior art method for determining signal margin in 2T2C FeRAM memory cells is to shift the bit line level by capacitor coupling. However, this method is unsatisfactory because it requires an additional capacitor.

It would therefore be desirable to provide a circuit with a test mode section for facilitating a worst case product test sequence for signal margin. It would also be desirable to design such a circuit for use with semiconductor memories in a 2T2C configuration without requiring additional capacitors in the circuit.

SUMMARY OF THE INVENTION

The present invention provides a test mode section for facilitating a worst case product test sequence for signal margin to ensure full product functionality over the entire component lifetime taking all aging effects into account. The invention works well with semiconductor memories having a 2T2C configuration. A semiconductor memory test mode configuration includes a first capacitor for storing digital data and connecting a cell plate line to a first bit line through a first select transistor. The first select transistor activated through a connection to a word line. A second capacitor stores digital data and connects the cell plate line to a second bit line through a second select transistor. The second select transistor is activated through a connection to the word line. A sense amplifier is connected to the first and second bit lines and measures a differential read signal on the first and second bit lines. A third transistor transfers charge between the first and second bit lines third to reduce the differential read signal.

Another aspect of the present invention includes a method for testing a semiconductor memory comprising the steps of pre-charging first and second bit lines; activating a cell plate line to produce a read signal on the first and second bit lines representing digital data stored by a pair of capacitors connected to the cell plate line through first and second transistors; activating a third transistor connected between the first and second bit lines for a time interval to transfer charge between the bit lines; activating a sense amplifier connected to the first and second bit lines thereby boosting read signals on the first and second bit lines; and determining a reduced differential read signal on the first and second bit lines due to the changed amount of charge on the bit lines.

BRIEF DESCRIPTION OF THE FIGURES

Further preferred features of the invention will now be described for the sake of example only with reference to the following figures, in which.

DETAILED DESCRIPTION OF THE EMBODIMENTS

Figure 1:
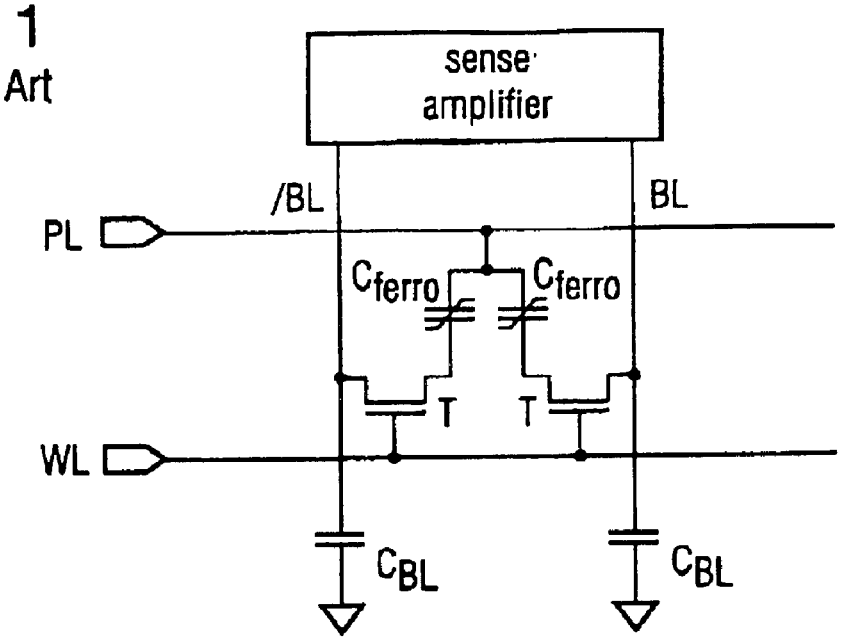
FIG. 1 illustrates a 2T2C memory configuration of the prior art.
Figure 2:
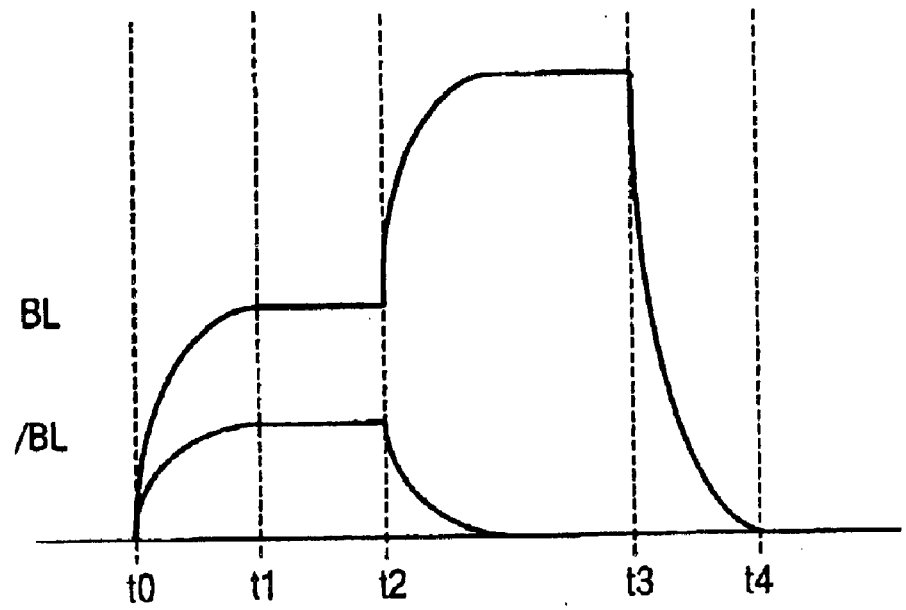
FIG. 2 plots the signals on the bit lines during a read access cycle in the prior art circuit of FIG. 1.
Figure 3:
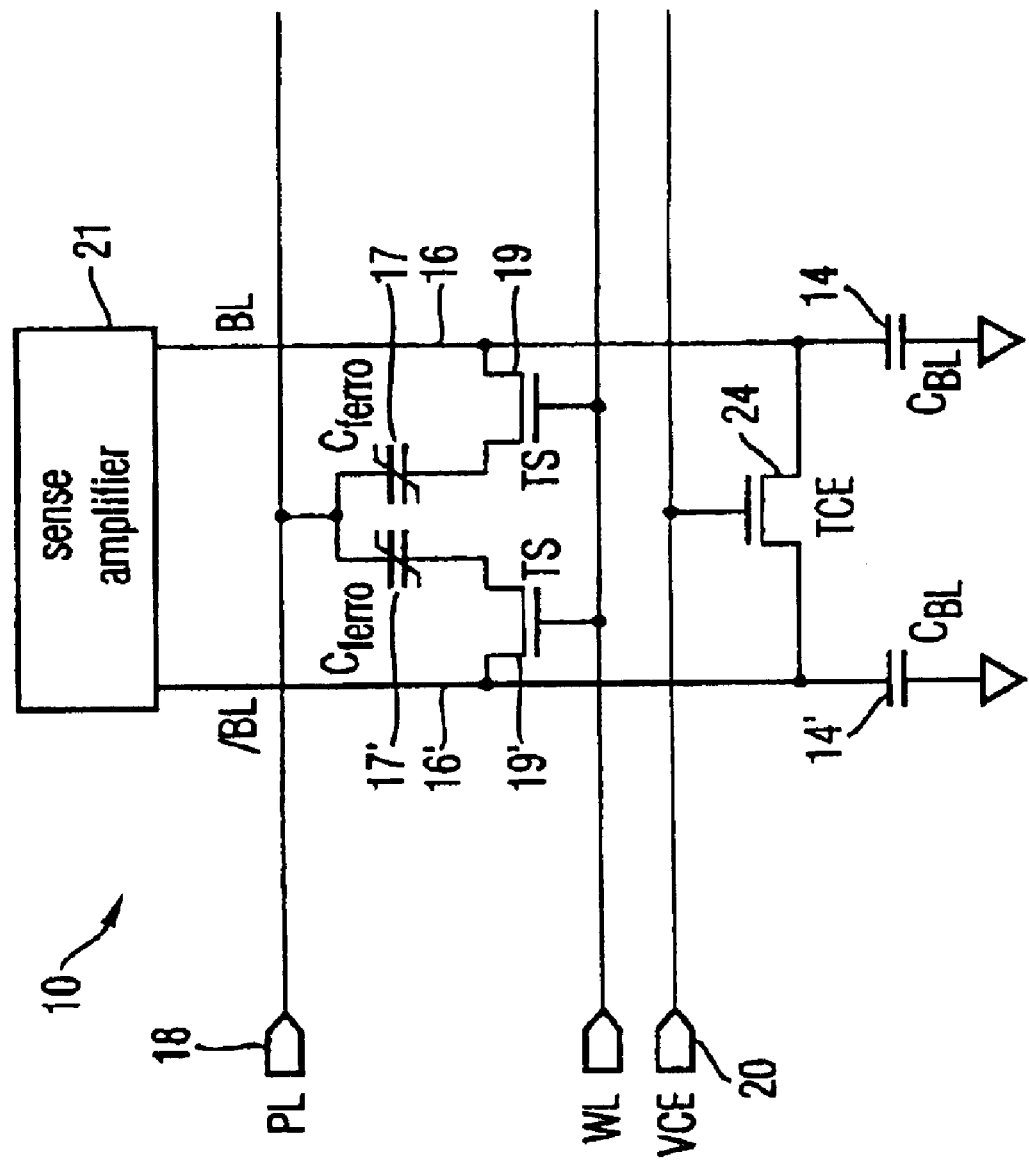
FIG. 3 shows a memory configuration of the present invention having a transistor for exchanging charge between BL and /BL.

FIG. 3 shows a circuit schematic of a memory cell 10 according to the invention. The circuit of FIG. 3 differs from the prior art circuit of FIG. 1 in that a transistor TCE 24 connects bit line /BL 16' with bit line BL 16. The transistor TCE 24 attaches to the bit lines /BL 16' and BL 16 at points such that the bit line capacitors CBL 14', 14 are between the connection points and ground.

The transistor is activated at it's gate by a signal input VCE 20. The signal input VCE 20 is kept at non-active (wherein the transistor VCE 20 is off) during normal operation and the circuit is electrically similar to the circuit shown in FIG. 1. During testing, the signal VCE 20 can be activated thereby transferring charge between the bit lines BL 16 and /BL 16'.

The memory cell 10 of FIG. 3 provides a test mode circuit for testing for signal margin. In order to test the memory cell 10, data is first written into the memory cell 10 and afterwards the data is read and compared to the expected (i.e. written) data 2T2C signal margin can be tested by selectively reducing the difference between a "0" signal on one bit line and a "1" signal on the other bit line. This is achieved by the present invention in a way that a defined charge exchange is performed between the bit lines BL 16 and /BL 16' after the read signals have developed. In one implementation, the transistor TCE 24 connects BL 16 and /BL 16' as illustrated in FIG. 3. By adjusting the control signal VCE 20 (gate-source voltage) and the time the gate is opened, a defined amount of 15 charge is allowed to flow from the bit line with the "1" signal to the bit line with the "0" signal, thereby reducing the "1" and increasing the "0" simultaneously as illustrated in FIG. 4.

The effect of this test mode is that after signal development on the bit lines (following the activation of a common plate line PL 18 and just before sense amplifier 21 activation) the difference between the "0" signal on the bit line /BL 16' (see FIG. 3) and the "1" signal on the bit line BL 16 (again, see FIG. 3) is smaller than in the normal read operation. The result of this test mode is a reduced differential read signal (i.e. the difference between the two bit-line signals) which tightens the margin for a save operation of the chip (the worst case test condition).

Figure 4:
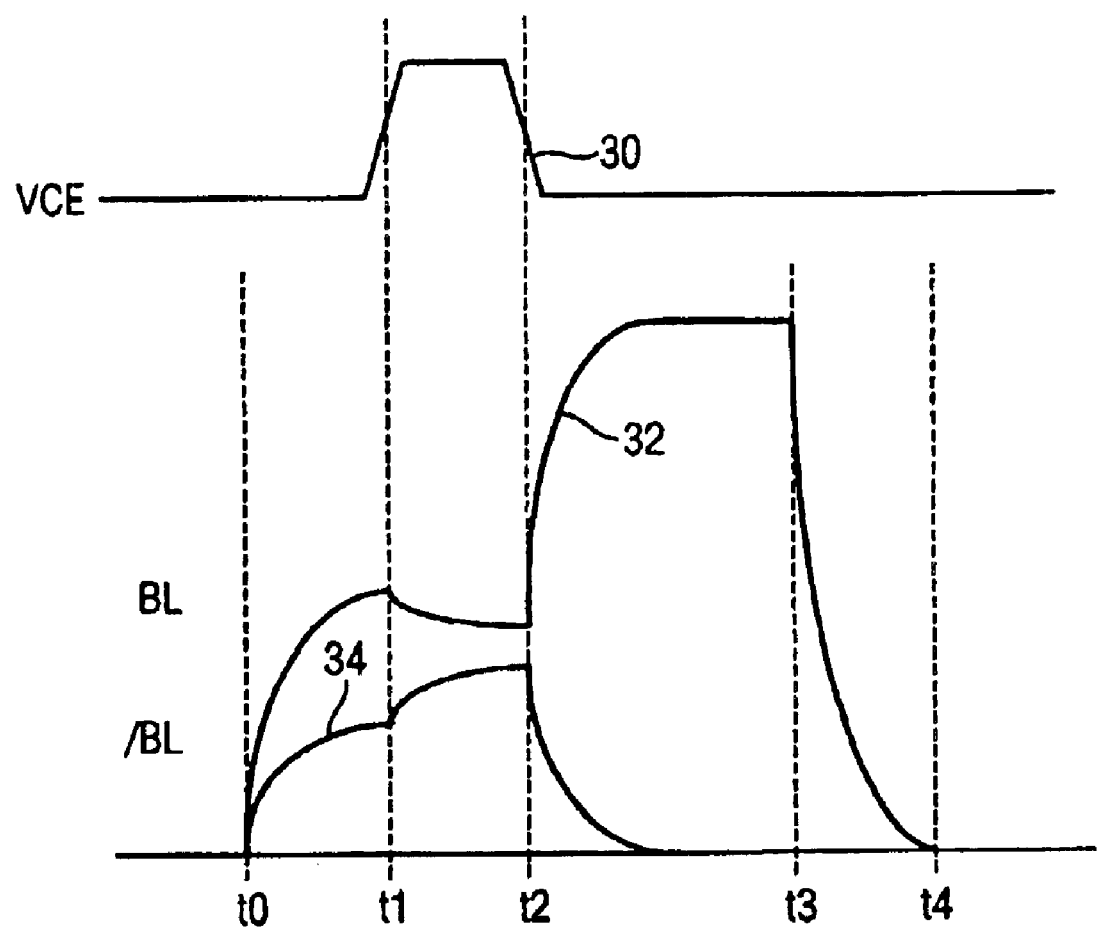
FIG. 4 plots the signals on the bit lines along with the signal VCE during a read access cycle for the circuit of FIG. 3.

The corresponding bit-line 16, 16' signals are shown in FIG. 4. The trace 30 represents the signal VCE 30 for activating the transistor TCE 24. The traces 32 and 34 represent the signal levels on the bit lines BL 16 and /BL 16', respectively. In this example, the bit line /BL 16' is assumed to be the bit line with the lower read signal. The bit lines BL 16 and /BL 16' are pre-charged to a certain level (e.g. 0V in the figure) and at time t0 the common plate line (PL) 18 is activated and a read signal appears on the bit lines according to the capacitance ratio Cferro/CBL. Here, Cferro is the capacitance of storage capacitors Cferro 17 and Cferro 17' which are connected to the plate 18 on one side and to the pair of bit lines (BL 16, /BL 16') on the other side via two select transistors (TS) 19, 19'. CBL is the capacitance of dedicated bit line capacitances (CBL) 14, 14' connected to each bit line. At time t1 the full read signals are developed on the two bit lines 16, 16'. The signal VCE 30 is activated switching on the transistor TCE 24 and opening up a charge transfer path between the bit lines BL 16 and /BL 16'. The signal VCE 30 can be, in general, activated during the time after signal development on the bit lines (soon after activation of a common plate line PL 18) and can be deactivated just before sense amplifier 21 activation. However, there is no limitation on the activation period for the signal VCE 30. The activation period of the signal VCE 30 and the corresponding on-time of the transistor TCE 24 should at least partially overlap the period of time between activation of the common plate line PL 18 at time t0 and the sense amplifier 21 activation time t2. The charge on the bit line with the higher read signal is decreased while the charge on the bit line with the lower read signal is increased resulting in a decreased signal on this bit lines at t2 when a sense amplifier 21 is activated and the bit line signals are boosted to the full bit line voltages. As a result, the differential read signal, i.e. the difference between the two bit-line signals, is decreased accordingly, which tightens the margin for a save operation of the chip (the worst case test condition). At t3 the sense amplifier is deactivated and the access cycle ends at t4.

The higher signal, on bit line BL 16, is therefore reduced while the lower signal, on bit line /BL 16', is increased, and the difference between the higher and lower bit line signals becomes smaller for this test. The amount of "signal margin" can be controlled by the time window during which the transistor TCE 24 is switched on.

One example of the procedure to test for the analog value of the signal margin is illustrated by the following steps:

1. Write data to and then read data from the memory cell in normal operation (without activating the transistor TSM 24). If the differential read signal is too small, then a comparison of the read data with the write data fails, thereby indicating that the circuit has no signal margin. If the differential read signal is sufficiently large then step 2 is performed.

2. Write data to and then read data from the memory cell with the time window of the transistor 24 set to a small value signal margin (SM0) to drain some of the charge from the bit lines. If the differential read signal is too small, then a comparison of the read data with the write data fails, thereby indicating that the circuit has no signal margin. If the differential read signal is sufficiently large then step 3 is performed.

3. Write data to and then read data from the memory cell with the time window of the transistor 24 set to a slightly larger value corresponding to first signal margin (SM1) to drain some of the charge from the bit lines. If the differential read signal is too small, then a comparison of the read data with the write data fails, thereby indicating that the circuit has a signal margin corresponding to SM0. If the differential read signal is sufficiently large then step 4 is performed.

4. Write data to and then read data from the memory cell with the time window of the transistors 24 set to an even larger value corresponding to second signal margin (SM2) to drain more of the charge from the bit lines. If the differential read signal is too small, then a comparison of the read data with the write data fails, thereby indicating that the circuit has a signal margin corresponding to SM1, If the differential read signal is sufficiently large then the test is continued until the failure of the comparison.

In an alternative embodiments, the potential VCE 20 is generated chip internally (on the same chip) or is provided externally.

In another alternative embodiment, a more sophisticated constant current sink/source is implemented instead of a transistor TCE, providing more accurate control of the amount of charge that is exchanged between BL and /BL.

Thus, although the invention has been described above using particular embodiments, many variations are possible within the scope of the claims, as will be clear to a skilled reader.

We claim:

1. A semiconductor memory test mode configuration, comprising:
    a first capacitor for storing digital data connecting a cell plate line to a first bit line through a first select transistor, the first select transistor activated through a connection to a word line;
    a second capacitor for storing digital data connecting the cell plate line to a second bit line through a second select transistor, the second select transistor activated through a connection to the word line;
    a sense amplifier connected to the first and second bit lines for measuring a differential read signal on the first and second bit line;
    a charge path for transferring charge between the first and second bit lines to reduce the differential read signal; and
    a controller arranged to activate the charge path to transfer charge between the first and second bit lines in a period at least partially overlapping a period of time between activation of the plate line and activation of the sense amplifier during a test.

2. The semiconductor memory test mode configuration of claim 1, wherein the first bit line has a lower read signal than the second bit line and charge is bassed from the second bit line to the first bit line through the charge path.

3. The semiconductor memory test mode configuration of claim 1, wherein the charge path transfers charge and ends the transfer of charge in response to a signal activated for a period of time.

4. The semiconductor memory test mode configuration of claim 1, wherein the charge transfer path is a third transistor turned on and off in response to a signal.

5. The semiconductor memory test mode configuration of claim 4, wherein the signal is generated chip-internally.

6. The semiconductor memory test mode configuration of claim 4, wherein the signal is input into a gate of the third transistor and the transistor has a drain and a source connected to the first and second bit lines.

7. A Ferroelectric Random Access Memory having the semiconductor memory test mode configuration of claim 1.

8. The semiconductor memory test mode of claim 1, wherein the first and second capacitors are ferroelectric capacitors.

9. The semiconductor memory test mode of claim 1, further comprising a bit line capacitor connected between the third transistor and ground.

10. The semiconductor memory test mode configuration of claim 1, wherein the charge transfer path is constant current sink or source.

11. A method for testing a semiconductor memory comprising the steps of:
    pre-charging first and second bit lines;
    activating a cell plate line to produce a read signal on the first and second bit lines representing digital data stored by a pair of capacitors connected to the cell plate line through first and second transistors;
    activating a third transistor connected between the first and second bit lines for a time interval to transfer charge between the bit lines;
    activating a sense amplifier connected to the first and second bit lines thereby boosting read signals on the first and second bit lines; and
    determining a reduced differential read signal on the first and second bit lines due to the changed amount of charge on the bit lines;
    wherein the third transistor is activated to transfer charge between the first and second bit lines in a period at least partially overlapping a period of time between activating the cell plate line and activating the sense amplifier.

* * * * *